United States Patent
Chen et al.

(10) Patent No.: US 8,255,866 B2
(45) Date of Patent: Aug. 28, 2012

(54) COMPUTING DEVICE AND METHOD FOR CHECKING DISTANCES BETWEEN TRANSMISSION LINES AND ANTI-PADS ARRANGED ON PRINTED CIRCUIT BOARD

(75) Inventors: Han-Long Chen, Shenzhen (CN); Shi-Piao Luo, Shenzhen (CN); Cheng-Hsien Lee, Tu-Cheng (TW); Chia-Nan Pai, Tu-Cheng (TW); Shou-Kuo Hsu, Tu-Cheng (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/085,432

(22) Filed: Apr. 12, 2011

(65) Prior Publication Data
US 2012/0017191 A1    Jan. 19, 2012

(30) Foreign Application Priority Data
Jul. 19, 2010  (CN) .......................... 2010 1 0231195

(51) Int. Cl.
  *G06F 17/50*    (2006.01)
(52) U.S. Cl. ........................................ 716/137
(58) Field of Classification Search .................. 716/137
See application file for complete search history.

(56) References Cited

U.S. PATENT DOCUMENTS

| | | | |
|---|---|---|---|
| 5,485,081 A * | 1/1996 | Whitehead et al. ...... 324/763.01 |
| 6,357,036 B1 * | 3/2002 | Eka et al. ...................... 716/112 |
| 2002/0174413 A1 * | 11/2002 | Tanaka ............................ 716/13 |
| 2004/0250222 A1 * | 12/2004 | Saito et al. ......................... 716/4 |
| 2006/0161874 A1 * | 7/2006 | Harada et al. ..................... 716/8 |
| 2006/0288317 A1 * | 12/2006 | Hamada et al. ................... 716/5 |
| 2009/0001573 A1 * | 1/2009 | Jirawongsapiwat et al. . 257/738 |
| 2010/0181101 A1 * | 7/2010 | Han et al. ...................... 174/260 |
| 2010/0218151 A1 * | 8/2010 | Nakano .............................. 716/5 |
| 2011/0058291 A1 * | 3/2011 | Kosowsky et al. .............. 361/56 |
| 2011/0132648 A1 * | 6/2011 | Mutnury et al. .............. 174/260 |
| 2012/0046887 A1 * | 2/2012 | XiaoPing ........................ 702/57 |

* cited by examiner

*Primary Examiner* — Suchin Parihar
(74) *Attorney, Agent, or Firm* — Altis Law Group, Inc.

(57) ABSTRACT

A computing device and a method involves selection of one or more transmission lines from a printed circuit board (PCB) layout file, reading a transmission line from the one or more selected transmission lines, and determining neighboring anti-pads of the read transmission line in the PCB layout file. The computing device and method further determine an actual distance between the read transmission line and a neighboring anti-pad. If the actual distance is less than a preset standard distance, the computing device and method determine that the read transmission line and the neighboring anti-pad do not satisfy design requirements, and highlight the read transmission line and the neighboring anti-pad, to prompt a user to amend design of the read transmission line and the neighboring anti-pad.

18 Claims, 4 Drawing Sheets

COMPUTING DEVICE AND METHOD FOR CHECKING DISTANCES BETWEEN TRANSMISSION LINES AND ANTI-PADS ARRANGED ON PRINTED CIRCUIT BOARD

BACKGROUND

1. Technical Field

Embodiments of the present disclosure relate to circuit simulating systems and methods, and more particularly, to a computing device and a method for checking distances between transmission lines and anti-pads arranged on a printed circuit board (PCB).

2. Description of Related Art

In PCB design, to ensure integrity of signals transmitted by transmission lines, distances between transmission lines and neighboring anti-pads may be required to satisfy predetermined standards, to avoid or reduce signal crosstalk such as electromagnetic interference and coupling of neighboring transmission lines. Presently, the distances between transmission lines and neighboring anti-pads are often acquired manually. With the large quantity of transmission lines and anti-pads distributed on the PCB, manual checking is not only time-consuming, but also error-prone.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

In general, the word "module," as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
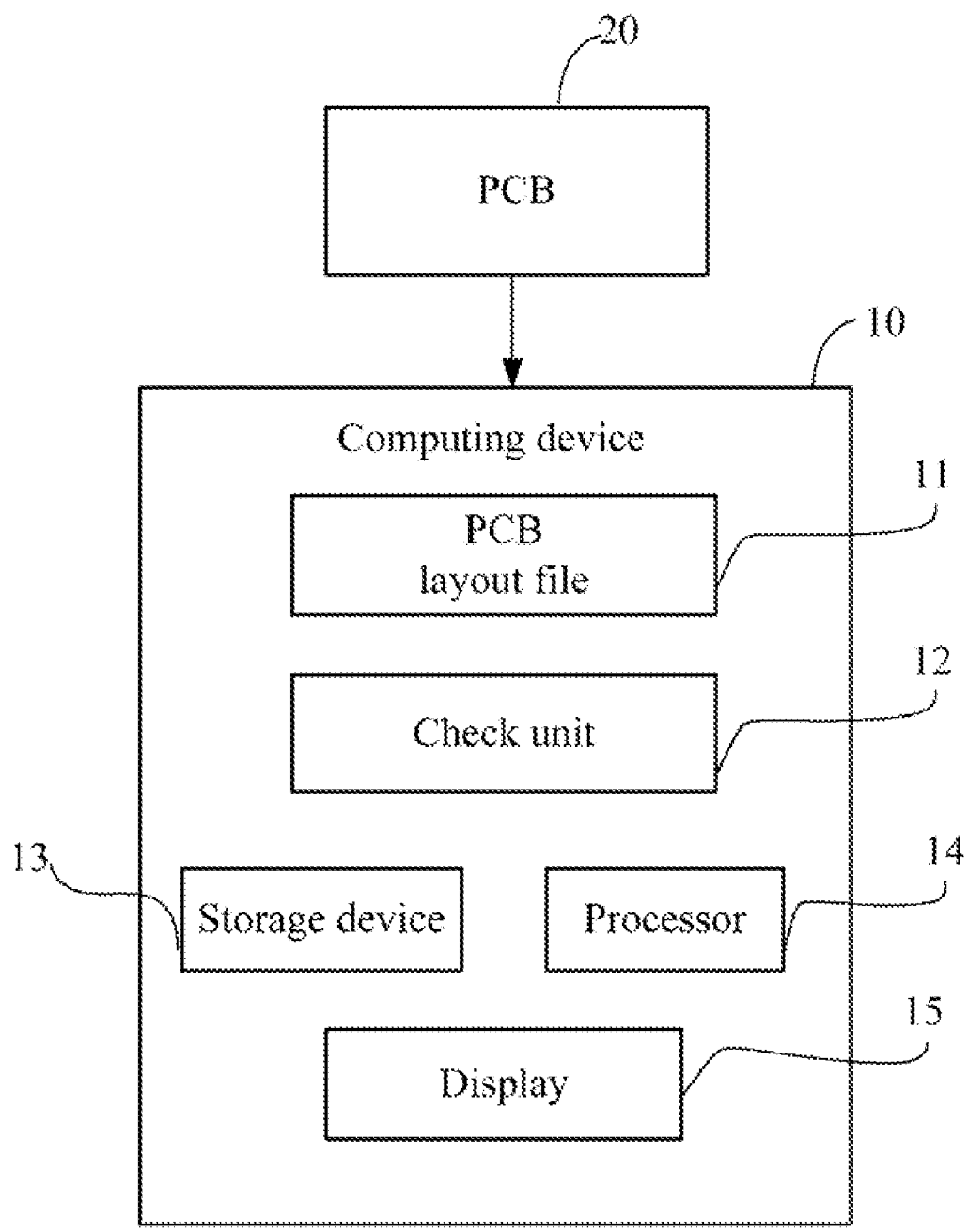
FIG. 1 is a block diagram of one embodiment of a computing device for checking distances between transmission lines and anti-pads arranged on a printed circuit board (PCB).

FIG. 1 is a block diagram of one embodiment of a computing device 10. The computing device 10 stores a printed circuit board (PCB) layout file 11 of a PCB 20. In this embodiment, the device 10 further includes a check unit 12, a storage device 13, a processor 14, and a display 15. The check unit 12 includes a number of function modules (detailed description is given in FIG. 2) The function modules may comprise computerized code in the form of one or more programs that are stored in the storage device 13. The computerized code includes instructions that are executed by the processor 14, to check whether distances between transmission lines and anti-pads arranged on the PCB 20 satisfy design requirements.

The display 15 displays the file 11 and a user interface allowing selection of transmission lines to be checked and output check results. Depending on the embodiment, the storage device 13 may be a smart media card, a secure digital card, or a compact flash card. The device 10 may be a personal computer, or a server, for example.

Figure 2:
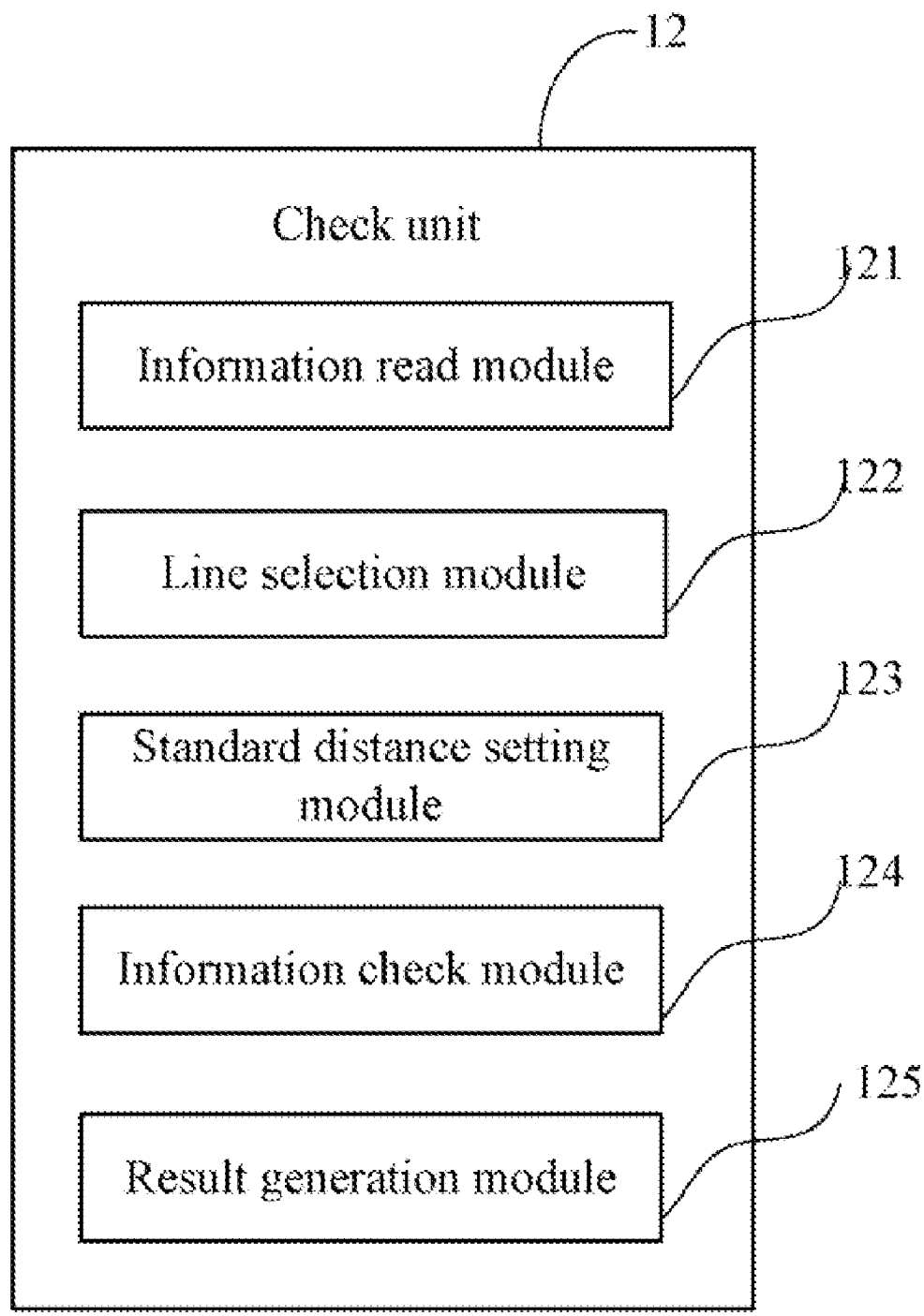
FIG. 2 is a block diagram of one embodiment of function modules of a check unit in the computing device of FIG. 1.

FIG. 2 is a block diagram of the function modules of the check unit 12 in the computing device 10 of FIG. 1. In one embodiment, the check unit 12 includes an information reading module 121, a line selection module 122, a standard distance setting module 123, an information check module 124, and a result generation module 125.

The information reading module 121 reads the file 11 from the storage device 13. In one embodiment, the file 11 includes layout information of components, such as the transmission lines, vias, and anti-pads arranged on the PCB 10. The layout information may include types of the transmission lines, the number of the transmission lines arranged on the PCB 10, a length of each transmission line, and sizes of the vias and anti-pads, for example.

The line selection module 122 receives one or more signal transmission lines selected by a user from the file 11. The user may select one transmission line at one time, or select more than one transmission lines having the same design standards at one time. For example, in one embodiment, all transmission lines which have the same design standards as a transmission line "L1" in FIG. 4 may be selected at one time. In one embodiment, the same design standards may include a material standard of the transmission lines, a distance between a transmission line and a neighboring transmission line, and a standard distance between the transmission line and a neighboring anti-pad.

The standard distance setting module 123 receives a standard distance between each selected transmission line and each neighboring anti-pad set by the user. For example, the standard distance may be set as 30 mil.

The information reading module 121 reads a transmission line from the one or more selected transmission lines. For example, the transmission line "L1" shown in FIG. 4 may be read.

Figure 4:
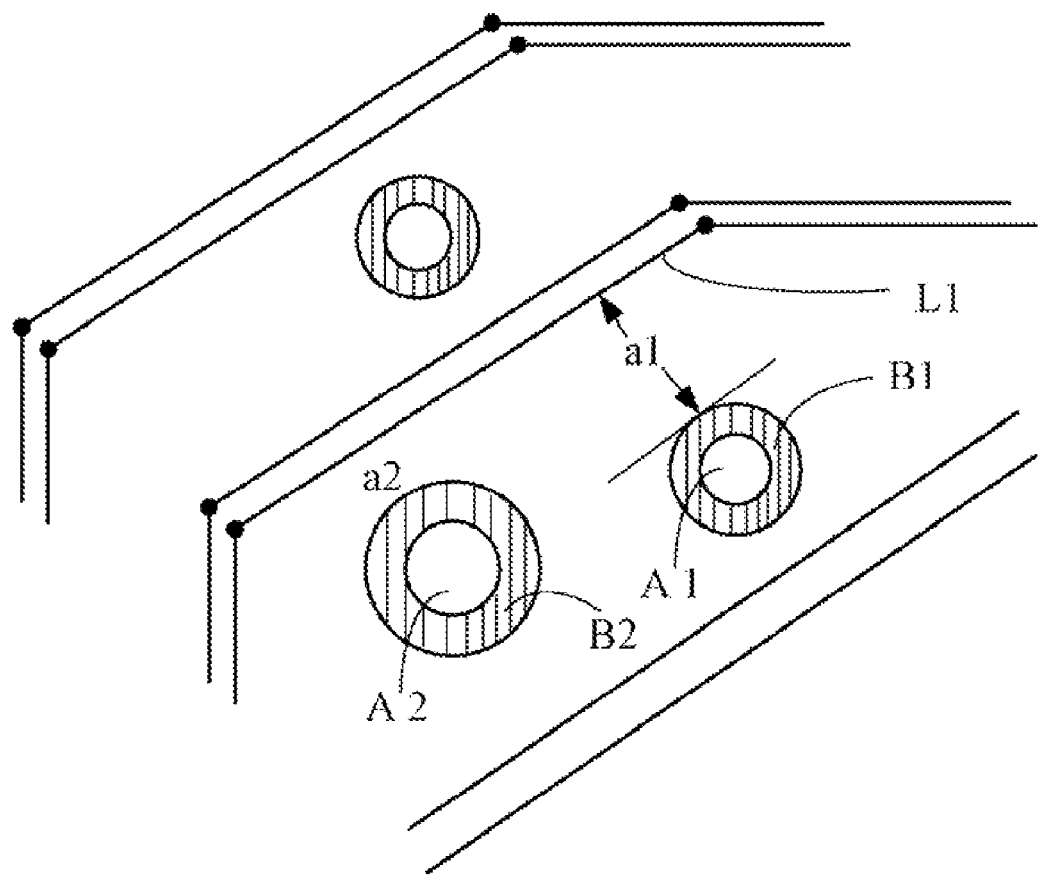
FIG. 4 is one embodiment illustrating transmission lines and anti-pads arranged on a PCB.

The information check module 124 determines neighboring anti-pads of the read transmission line. As shown in FIG. 4, circles such as those labeled "A1" and "A2" represent vias arranged on the PCB 20, shaded circles such as those labeled "B1" and "B2" represent anti-pads arranged on the PCB 20. The information check module 124 determines the anti-pads "B1" and "B2" are neighboring anti-pads of the transmission line "L1."

The information check module 124 further determines an actual distance between the read transmission line and each neighboring anti-pad, and determines that the transmission line and a corresponding neighboring anti-pad do not satisfy design requirements if the actual distance is less than the standard distance. For example, the information check module 124 determines a distance "a1" between the transmission line "L1" and the anti-pad "B1", and if "a1" is less than 30 mil, the information check module 124 determines that the transmission line "L1" and the anti-pad "B1" do not satisfy the design requirements.

The result generation module 125 highlights the transmission lines and anti-pads that do not satisfy the design requirements in the file 11, and generate a report file recording information of the transmission lines and anti-pads that do not satisfy the design requirements, to prompt the user to modify the design of the highlighted transmission lines and anti-pads.

Figure 3:
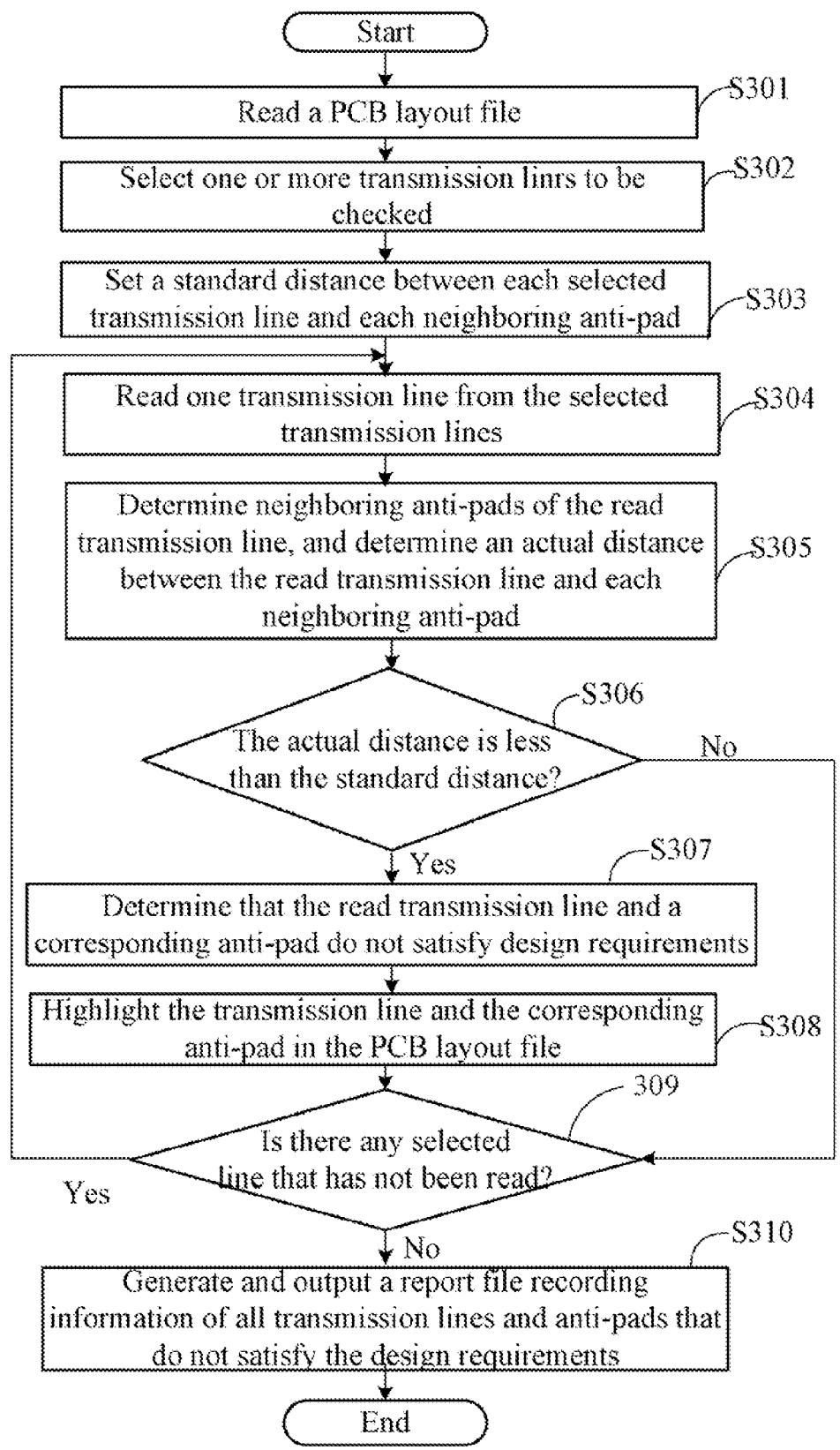
FIG. 3 is a flowchart of one embodiment of a method for checking distances between transmission lines and anti-pads arranged on a PCB.

FIG. 3 is a flowchart of one embodiment of a method for checking distances between transmission lines and anti-pads arranged on the PCB 20. Depending on the embodiment, additional blocks may be added, others removed, and the ordering of the blocks may be changed.

In block S301, the information reading module 121 reads the file 11 from the storage device 13. As mentioned above, the file 11 includes layout information of components, such as the transmission lines, vias, and anti-pads arranged on the PCB 10. The layout information may include types of the transmission lines, the number of the transmission lines arranged on the PCB 10, a length of each transmission line, and sizes of the vias and anti-pads, for example.

In block S302, the line selection module 122 receives one or more signal transmission lines, which have the same design standards, selected by a user from the file 11. For example, in one embodiment, all transmission lines which have the same design standards as a transmission line "L1" in FIG. 4 may be selected at one time. As mentioned above, the same design standards may include a material standard of the transmission lines, a distance between a transmission line and a neighboring transmission line, and a standard distance between the transmission line and a neighboring anti-pad.

In block S303, the standard distance setting module 123 receives a standard distance between each selected transmission line and each neighboring anti-pad set by the user. For example, the standard distance may be set as 30 mil.

In block S304, the information reading module 121 reads a transmission line from the one or more selected transmission lines. For example, the information reading module 121 reads the transmission line "L1" shown in FIG. 4.

In block S305, the information check module 124 determines neighboring anti-pads of the read transmission line, and determines an actual distance between the read transmission line and each neighboring anti-pad. For example, the information check module 124 determines the anti-pads "B1" and "B2" are neighboring anti-pads of the transmission line "L1" in FIG. 4. The information check module 124 determines an actual distance "a1" between the transmission line "L1" and the anti-pad "B1," and an actual distance "a2" between the transmission line "L1" and the anti-pad "B2."

In block S306, the information check module 124 determines if the actual distance between the read transmission line and any neighboring anti-pads is less than the standard distance, to determine if the read transmission line and the corresponding neighboring anti-pads satisfy design requirements. If the actual distance between the read transmission line and each neighboring anti-pad is equal to or more than the standard distance, the procedure goes to block S309. Otherwise, if the actual distance is less than the standard distance, the procedure goes to block S307.

In block S307, the information check module 124 determines that the read transmission line and a corresponding neighboring anti-pad do not satisfy the design requirements. For example, if "a1" is less than 30 mil, the information check module 124 determines that the design of the transmission line "L1" and the anti-pad "B1" do not satisfy the design requirements.

In block S308, the result generation module 125 highlights the read transmission line and the anti-pad that do not satisfy the design requirements in the PCB layout file 11, to prompt the user to modify design of the highlighted transmission line and anti-pad.

In block S309, the information check module 124 checks if there is any selected transmission line that has not been read. If there is any selected transmission line that has not been read, the procedure repeats from block S304 until all selected transmission lines have been read, then the procedure goes to block S310.

In block S310, the result generation module 125 generates a report file recording information of all transmission lines and anti-pads that do not satisfy the design requirements, and outputs the report file on the display 15.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer-based method for checking distances between transmission lines and anti-pads arranged on a printed circuit board (PCB), the method comprising:
   reading a PCB layout file from a storage device of a computing device, wherein the PCB layout file comprises layout information of components arranged on the PCB;
   selecting one or more transmission lines having the same design standards from the PCB layout file;
   setting a standard distance between each selected transmission line and each neighboring anti-pad arranged on the PCB;
   reading a transmission line from the one or more selected transmission lines;
   determining neighboring anti-pads of the read transmission line, and determining an actual distance between the read transmission line and each neighboring anti-pad;
   determining that the transmission line and a neighboring anti-pad do not satisfy design requirements, on condition that an actual distance between the read transmission line and the neighboring anti-pad is less than the standard distance; and
   highlighting the read transmission line and the corresponding anti-pad in the PCB layout file, to prompt a user to modify design of the highlighted transmission line and anti-pad.

2. The method as claimed in claim 1, further comprising:
   generating a report file recording information of all transmission lines and anti-pads that do not satisfy the design requirements, and outputting the report file on a display of the computing device.

3. The method as claimed in claim 1, wherein the layout information of components arranged on the PCB comprises types of the transmission lines, the number of the transmission lines, a length of each transmission line, and sizes of vias and anti-pads arranged on the PCB.

4. The method as claimed in claim 1, wherein the same design standards comprise a material standard of the transmission lines, a distance between a transmission line and a neighboring transmission line, and the standard distance between the transmission line and a neighboring anti-pad.

5. The method as claimed in claim 1, wherein the computing device is a personal computer or a server.

6. The method as claimed in claim 1, wherein the storage device is selected from the group consisting of a smart media card, a secure digital card, and a compact flash card.

7. A computing device, comprising:
   a storage device;
   at least one processor; and
   a check unit comprising computerized code in the form of one or more programs, which are stored in the storage device and executable by the at least one processor, the one or more programs comprising:

an information reading module operable to read a printed circuit board (PCB) layout file from the storage device, wherein the PCB layout file comprises layout information of components arranged on a PCB;

a line selection module operable to select one or more transmission lines having the same design standards from PCB layout file;

a standard distance setting module operable to set a standard distance between each selected transmission line and each neighboring anti-pad arranged on the PCB;

an information check module operable to determine an actual distance between each selected transmission line and a neighboring anti-pad, and determine that the selected transmission line and the neighboring anti-pad do not satisfy design requirements, in response that the actual distance is less than the standard distance; and a result generation module operable to highlight the selected transmission line and the neighboring anti-pad that do not satisfy the design requirements in the PCB layout file, to prompt a user to modify design of the highlighted transmission line and anti-pad.

8. The computing device as claimed in claim 7, wherein the result generation module is further operable to generate a report file recording information of all transmission lines and anti-pads that do not satisfy the design requirements, and output the report file on a display of the computing device.

9. The computing device as claimed in claim 7, wherein the layout information of components arranged on the PCB comprises types of the transmission lines, the number of the transmission lines, a length of each transmission line, and sizes of vias and anti-pads arranged on the PCB.

10. The computing device as claimed in claim 7, wherein the same design standards comprise a material standard of the transmission lines, a distance between a transmission line and a neighboring transmission line, and the standard distance between the transmission line and a neighboring anti-pad.

11. The computing device as claimed in claim 7, wherein the storage device is selected from the group consisting of a smart media card, a secure digital card, and a compact flash card.

12. The computing device as claimed in claim 7, wherein the computing device is a personal computer or a server.

13. A non-transitory computer readable medium storing a set of instructions, the set of instructions capable of being executed by a processor of a computing device to perform a method for checking distances between transmission lines and anti-pads arranged on a printed circuit board (PCB), the method comprising:

reading a PCB layout file from a storage device of a computing device, wherein the PCB layout file comprises layout information of components arranged on the PCB;

selecting one or more transmission lines having the same design standards from PCB layout file;

setting a standard distance between each selected transmission line and each neighboring anti-pad arranged on the PCB;

reading a transmission line from the one or more selected transmission lines;

determining neighboring anti-pads of the read transmission line, and determining an actual distance between the read transmission line and each neighboring anti-pad;

determining that the transmission line and a neighboring anti-pad do not satisfy design requirements, in response that an actual distance between the read transmission line and the neighboring anti-pad is less than the standard distance; and highlighting the read transmission line and the corresponding anti-pad in the PCB layout file, to prompt a user to modify design of the highlighted transmission line and anti-pad.

14. The non-transitory computer readable medium as claimed in claim 13, wherein the method further comprises: generating a report file recording information of all transmission lines and anti-pads that do not satisfy the design requirements, and outputting the report file on a display of the computing device.

15. The non-transitory computer readable medium as claimed in claim 13, wherein the layout information of components arranged on the PCB comprises types of the transmission lines, the number of the transmission lines, a length of each transmission line, and sizes of vias and anti-pads arranged on the PCB.

16. The non-transitory computer readable medium as claimed in claim 13, wherein the same design standards comprise a material standard of the transmission lines, a distance between a transmission line and a neighboring transmission line, and the standard distance between the transmission line and a neighboring anti-pad.

17. The non-transitory computer readable medium as claimed in claim 13, wherein the computing device is a personal computer or a server.

18. The non-transitory computer readable medium as claimed in claim 13, wherein the non-transitory computer readable medium is selected from the group consisting of a smart media card, a secure digital card, and a compact flash card.

* * * * *